United States Patent [19]

Oda et al.

[11] Patent Number: 5,153,688
[45] Date of Patent: Oct. 6, 1992

[54] METHOD AND DEVICE FOR CONTROLLING INTERFERENCE OF ELECTRON WAVES BY LIGHT IN WHICH A TRANSVERSE MAGNETIC WAVE IS APPLIED

[75] Inventors: Hitoshi Oda; Masahiro Okuda, both of Sagamihara, Japan

[73] Assignee: Canon Kabushiki Kaisha, Tokyo, Japan

[21] Appl. No.: 687,568

[22] Filed: Apr. 19, 1991

[30] Foreign Application Priority Data

Apr. 21, 1990 [JP] Japan .................................. 2-105745

[51] Int. Cl.$^5$ .............................................. H01L 27/14
[52] U.S. Cl. ............................................ 357/30; 357/19; 357/4; 357/16; 357/90; 357/26; 359/282; 359/281; 359/283; 359/248; 359/246
[58] Field of Search ...................... 357/30 I, 30 E, 19, 357/4, 16, 25, 26, 90, 27; 350/96.12, 96.13, 96.14; 359/282, 281, 283, 284, 246, 248, 251; 372/46, 50

[56] References Cited

U.S. PATENT DOCUMENTS

| | | | |
|---|---|---|---|
| 4,957,337 | 9/1990 | Ogawa et al. | 357/30 E X |
| 4,993,036 | 2/1991 | Ikeda et al. | 372/50 |

OTHER PUBLICATIONS

Imry et al., "Quantum Interference and the Aharonov–Bohm Effect", *Scientific American*, Apr. 1989, pp. 56–62.
Rekalova et al., "Channel Method for Detection of Magnetic Field", *Sov. Phys. Semicond*, vol. 10, No. 2, Feb. 1976, pp. 213–214.
Ginter et al., "Indirect Exchange Interaction via Electrons in Spin–Orbit Coupled Bands in Semiconductors", *Phys. Stat. Sol.*, vol. 96, 1979, pp. 735–745.
Yamanishi et al., "Control of Quantum Interference Current Through Exchange Interaction Between Coherent Electron Waves and Photo-Excited Virtual Carriers", *Hiroshima University*, 1989 Science Lecture Conference, 27 p. –2–1, Nov. 27, 1984, p. 1030.
Daha et al., "Proposed Structure for Large Quantum Interference Effects", *Applied Physics Letters*, Feb. 17, 1986, pp. 487–89.

*Primary Examiner*—William Mintel
*Attorney, Agent, or Firm*—Fitzpatrick, Cella, Harper & Scinto

[57] ABSTRACT

An electron wave interference device controlled by a light is disclosed. The electron wave interference device includes a first channel to propagate an electron wave, a second channel arranged with an interval from the first channel for propagating an electron wave, and an magnetic field application device for applying a magnetic field into the first and second channels and a region sandwiched by those channels so as to traverse them. The electron waves which are respectively propagated in the first and second channels mutually interfere, and when the light is irradiated to those channels, a distance between peaks of wave functions of the electron waves which propagate in the channels is changed, so that a phase difference occurs in the electron waves.

94 Claims, 9 Drawing Sheets

⊙ DIRECTION OF MAGNETIC FIELD B

METHOD AND DEVICE FOR CONTROLLING INTERFERENCE OF ELECTRON WAVES BY LIGHT IN WHICH A TRANSVERSE MAGNETIC WAVE IS APPLIED

BACKGROUND OF THE INVENTION

1. Field of the Invention

The present invention relates to an electron wave interference device which is controlled by irradiating a light and a method of controlling an interference current by light by using such a device.

2. Related Background Art

It is considered that a system using light in a light transmission, a light conversion, a light computing device, or the like is a key system to realize a large capacity and a super high speed information processing in the future. Among them, the light communication device needs a super high speed photodetector and the light conversion device needs a photodetector which can be integrated at a high density.

To meet the above requirements, a method of controlling a quantum interference current by the light has been proposed by Yamanishi et al., "The Records of the Society of Applied Physics of Japan", page 27-z-1, Autumn, 1989. The principle of the above method will now be described hereinbelow.

An arm 71 on one side of an interferometer for an electron wave comprising a quantum thin line 70 as shown in FIG. 1, is irradiated by a light 72. In this case, a photon energy of the incident light 72 is set to be sufficiently smaller than an excition energy gap of the quantum thin line 70, thereby virtually causing a carrier, that is, causing a virtual transition. The virtual carrier generated in the arm 71 which has been excited by the light decreases an effective potential for an electron wave which propagates in the arm 71 through an exchange interaction according to an exchange energy, so that a quantum interference between the electron waves which propagate in two arms 71 and 73 can be controlled. At this time, an electron/hole carrier pair which has virtually been excited doesn't contribute to the conduction because such a pair relates to a coherent pair excitation.

Since it is a feature of the above method that structure is simple and quantum wave interference is controlled by virtual excitation by light, a switching time of the device is not limited by a CR time constant and a recombination life.

Another conventional technique will now be described. FIG. 2 is a schematic cross-sectional view showing a structure of a quantum interference device which has been proposed by S. Datta et al., "Applied Physics Lett. 48", page 487, 1986.

According to the above structure, two GaAs quantum well layers 80 and 81 are laminated in a z direction through an AlGaAs barrier layer 82. Since both edges of the barrier layer 82 are thin, a considerable tunneling exists between the well layers 80 and 81. However, since the barrier layer 82 in the central portion is thick, a tunneling hardly exists. The electron wave which enters from a contact 83 at the left edge is first coherent in two quantum wells 80 and 81, so that phases of the electron waves in the quantum wells 80 and 81 are coincident. Now, $|A>$ denotes an asymmetrical wave function of the electron wave and $|S>$ denotes a symmetrical wave function of the electron wave. In the central portion, namely, in the portion between $x=0$ and $x=L$, a magnetic field is applied in the y direction to the electron wave which has been propagated in the x direction so as to cause a phase difference of only $\pi$ between the upper and lower channels 80 and 81. This means that a band structure of the well layers 80 and 81 and an intensity of magnetic field which is applied are set so as to cause a phase difference of $\pi$. By applying a magnetic field as mentioned above, two electron waves which are interfered at the right edge and whose wave functions are respectively expressed by $|1>$ and $|2>$ are reflected because their energies are set to high levels. In other words, when the wave functions of the electron waves are recombined to one wave function at the right edge, a resultant waveform is set into the second state $|A>$ instead of the base state shown by $|S>$. However, since the electron wave has only an energy corresponding to $|S>$, it is reflected.

On the other hand, if the magnetic field is controlled such that the phase difference is equal to a value which is integer times as large as $2\pi$, one recombined electron wave can pass through the right edge and the same output current as the input current is obtained.

Therefore, a conductance shown in an axis of ordinate in FIG. 3 is expressed by a periodic function of the applied magnetic field, so that a passing current can be controlled in a wide range by modulating the magnetic field.

However, the structure of the foregoing former conventional example has the following problems. Consider the case of forming the quantum thin line 70 by GaAs as a compound semiconductor. To cause a virtual excitation from a valence band to a conduction band, it is necessary to use an irradiation light having a wavelength of 0.8 $\mu$m due to the relation with an energy interval. However, since lengths of arms 71 and 73 of the interference device are equal to at most 1 $\mu$m, it is very difficult to converge the light to only one side of the two arms 71 and 73 existing in such a micro region due to the relation with a diffraction limit.

The foregoing latter conventional example also has the following problems.

First, since the interference current is controlled by the magnetic field, high speed modulation is difficult. This is because an impedance of the coil becomes too large for a high frequency current which is needed to modulate the magnetic field at such a high speed. A frequency of tens of MHz is an upper limit frequency.

Second, a regrowth is preferable as necessary to form the structure as shown in FIG. 2. First, a structure is grown until the AlGaAs barrier layer 82 exists between two well layers 80 and 81 by a molecular beam epitaxy (MBE) method or an organic metal chemical vapor phase deposition (MO-CVD) method. After that, the structure is taken out into the atmosphere and is etched to form a thick portion and a thin portion of the barrier layer 82.

However, at this time, a surface oxidation and an adsorption of impurities cannot be avoided. Therefore, the GaAs quantum well layer 81 grown on the above structure has a rough hetero interface and contains many impurities and defects. Consequently, the electrons which run in the GaAs quantum well layer 81 are scattered and the phase is disturbed, so that an on/off ratio of the interference current decreases.

SUMMARY OF THE INVENTION

It is an object of the invention to solve the problems of the above conventional techniques and to provide an electron wave interference device which can be easily manufactured and driven. Another object is to provide a method of controlling an interference current by using such a device.

The above object of the invention is accomplished by an electron wave interference device which is controlled by a light, comprising: a first channel to propagate an electron wave; a second channel which is arranged with an interval from the first channel and propagates an electron wave; and means for applying a transverse magnetic field into the first and second channels and a region sandwiched by those channels, wherein the electron waves which are respectively propagated in the first and second channels mutually interfere, and when the light irradiate those channels, a distance between peaks of wave functions of the electron waves which propagate in the channels is changed, so that a phase difference occurs in the electron waves.

On the other hand, the above object is also accomplished by a method of controlling the propagation of electron waves by using the above device, comprising the steps of: respectively propagating the electron waves in first and second channels, in which the electron waves mutually interfere; applying a transverse magnetic field to the first and second channels and a region sandwiched by the channels; and irradiating the light to the first and second channels, wherein when the light is irradiated, a distance between peaks of wave functions of the electron waves which propagate in the channels is changed, so that a phase difference occurs in the electron waves and transmission coefficients of electron waves are changed.

According to the invention, an electron wave interference device of an embodiment comprises: a semiconductor member having a source portion, a gate portion, and a drain portion; a first channel for propagating an electron wave from the source portion to the drain portion through the gate portion; a second channel which is arranged with an interval from the first channel and propagates the electron wave from the source portion to the drain portion through the gate portion, in which the electron waves which respectively propagate in the first and second channels mutually interfere; means for applying a voltage between the source portion, and the drain portion; and means for applying a transverse magnetic field to the first and second channels and a region sandwiched by those channels, wherein when the light irradiate the first and second channels, a distance between peaks of wave functions of the electron waves which respectively propagate in the channels is changed, so that a phase difference occurs in the electron waves and an amount of current flowing between the source and drain portions changes.

On the other hand, a method of controlling a current flowing between source and drain portions by using the device of the above embodiment comprises the steps of: applying a voltage between the source and drain portions and propagating electron waves in first and second channels, in which the electron waves mutually interfere; applying a transverse magnetic field to the first and second channels and a region sandwiched by those channels; and irradiating a light to the first and second channels, wherein when the light is irradiated, a distance between peaks of wave functions of the electron waves which respectively propagate in the channels is changed, so that a phase difference occurs in the electron waves and an amount of current flowing between the source and drain portions changes.

DETAILED DESCRIPTION OF THE PREFERRED EMBODIMENTS

Figure 4:
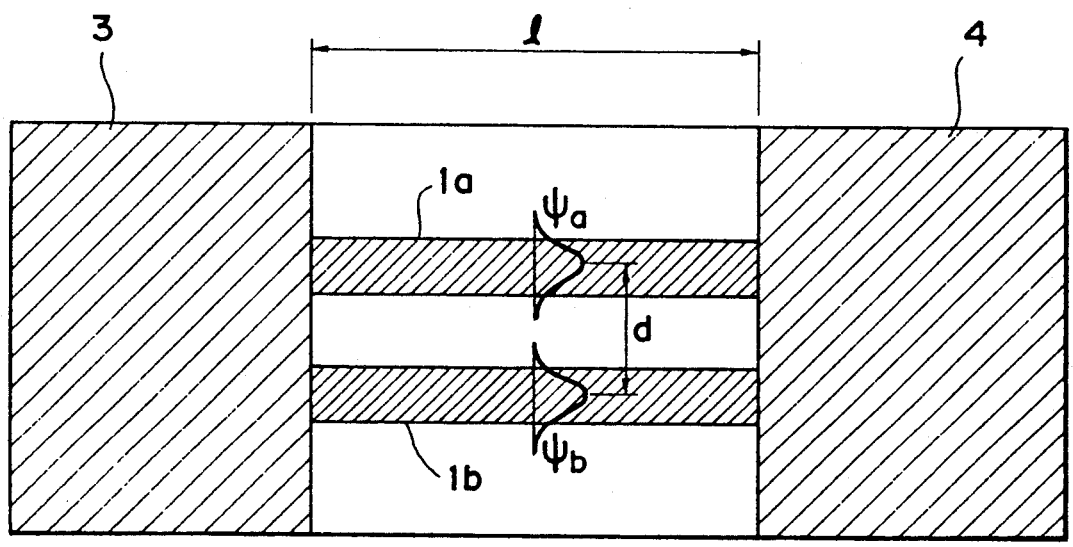
FIG. 4 is a schematic diagram for explaining the operation principle of an electron wave interference device of the invention.

FIG. 4 is a schematic diagram for explaining the principle of an electron wave interference device of the invention.

In FIG. 4, channels $1a$ and $1b$ are arranged between electrodes 3 and 4 with a predetermined distance. By applying a voltage across the electrodes, electron waves propagate in the channels, respectively. The channels are formed by, for instance, laminating quantum well layers made of semiconductors through a barrier layer.

A magnetic field is applied from the outside by means (not shown) to a region between the channels $1a$ and $1b$ on a surface sandwiched by the channels $1a$ and $1b$, that is, a surface which is parallel to a virtual surface including an arranging direction of the channels and a propagating direction of the electron waves. In the example, the above region is a region existing between two channels in the case where the device is cut out at a surface which is perpendicular to the film surface of the well layer and is parallel to the propagating direction of the electron waves.

In the device as mentioned above, the electron waves which respectively propagate in the channels $1a$ and $1b$ mutually interfere. A phase difference between the electron waves is proportional to the product of the magnetic field applied to the channel portions and a cross-sectional area surrounded by the two channels. When the phase difference changes, an amount of current flowing between the electrodes changes. This point will now be described hereinbelow.

Figure 1:
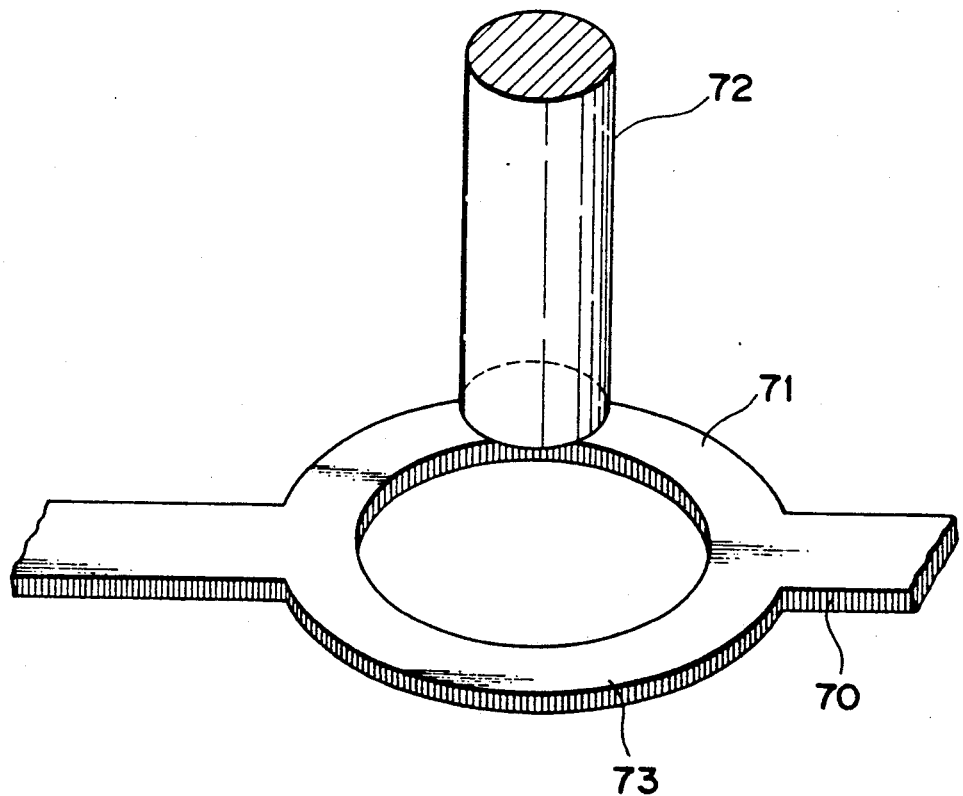
FIG. 1 is a schematic perspective view showing a first example of a conventional electron wave interference device.
Figure 2:
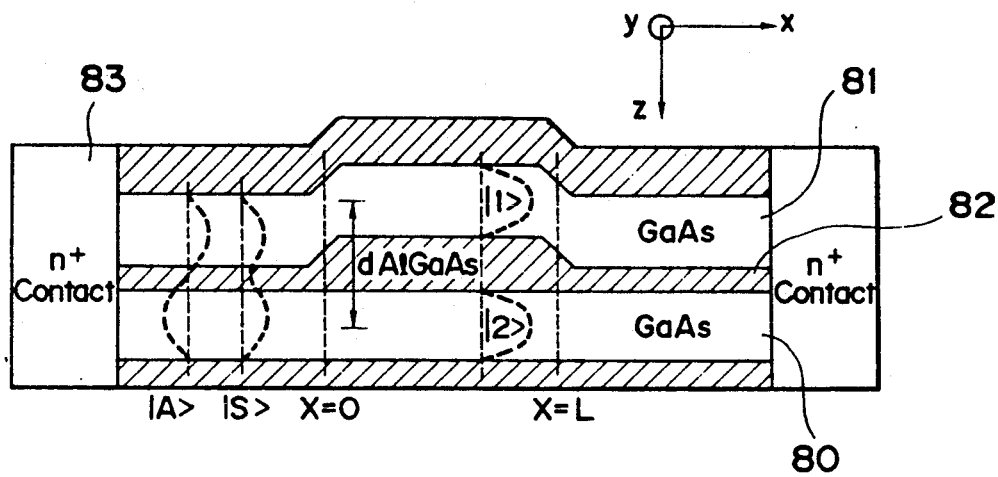
FIG. 2 is a schematic cross-sectional view showing a second example of a conventional electron wave interference device.

In the device of FIG. 1, a transmission coefficient $|T|^2$ of the electron wave between the electrodes is shown as follows.

$$|T|^2 = \cos^2\left(\frac{e}{\hbar} \cdot \frac{d \cdot l}{2} \cdot B\right) \quad (1)$$

where,
e: elementary charge of the electron
$\hbar = h/2\pi$
n: Planck's constant
d: distance between two channels $1a$ and $1b$
l: length of each of the channels $1a$ and $1b$
B: intensity of external magnetic field The external magnetic field is applied in the direction which is perpendicular to the paper surface of FIG. 4 and is located on the front side from the rear side.

As will be obviously understood from the equation (1), even if the intensity of magnetic field is constant, when a cross-sectional area ($d \cdot l$) of the surface sandwiched by the two channels through which the magnetic field changes, a phase difference between the electron waves which propagate in the channels changes.

In the above example, the distance d between the channels $1a$ and $1b$ is defined by a difference between expected values of the positions of wave functions $\psi_a$ and $\psi_b$ of the electron waves in the channels $1a$ and $1b$. Therefore, the interval d is expressed as follows.

$$d = \int \psi_a^* z \psi_a dz - \int \psi_b^* z \psi_b dz \quad (2)$$

According to the invention, by irradiating the light, the channel distance d is changed and the transmission coefficient is changed. Namely, the invention intends to control the interference current by using the light.

As a method of changing the interval d, there is a method using an exchange interaction and a method using an optical Stark effect. The above methods will now be described hereinbelow.

(I) Method using the exchange interaction

Figure 5:
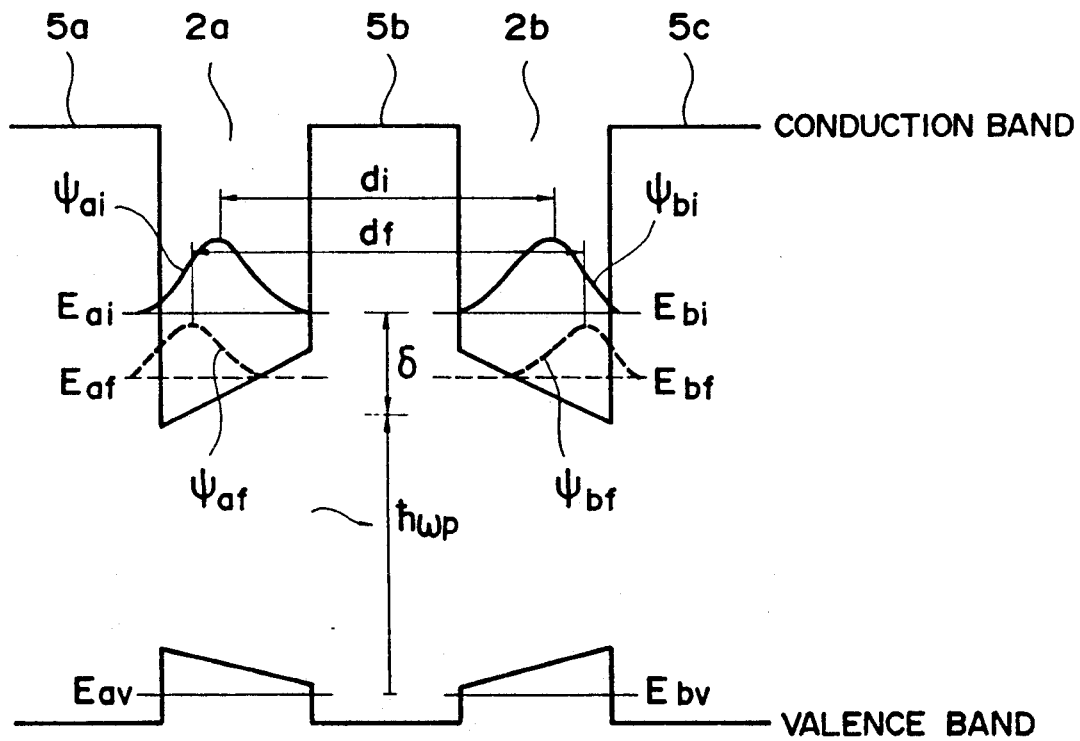
FIG. 5 is a diagram showing a first example of an energy band structure of channels in the device of the invention.

FIG. 5 shows an energy band diagram of a semiconductor layer in the case where the channels of the device of FIG. 4 are constructed by semiconductor layers of a quantum well structure. In FIG. 5, reference numerals $2a$ and $2b$ denote quantum well layers constructing the channels $1a$ and $1b$ in FIG. 4. Barrier layers $5a$, $5b$, and $5c$ having band gaps wider than those of the quantum well layer are provided between the quantum well layers and on both sides thereof.

The quantum well layers $2a$ and $2b$ have band structures which are inclined in the opposite directions. That is, the well layers $2a$ and $2b$ are formed such that the band gaps are gradually widened as they are away from the barrier layer $5b$. For instance, assuming that the well layers are made of $Al_xGa_{1-x}As$, such structures can be realized by continuously changing a composition ratio x of Al. As the value of x increases, the band gap is widened.

The well layers $2a$ and $2b$ have base quantum levels $E_{ai}$ and $E_{bi}$. Wave functions $\psi_{ai}$ and $\psi_{bi}$ exist in the levels $E_{ai}$ and $E_{bi}$, respectively. Assuming that the well layers $2a$ and $2b$ of the valence band have energy levels of $E_{av}$ and $E_{bv}$, respectively, a pump light having a photon energy $\hbar\omega_p$ which satisfies the following conditions is irradiated to the well layers $2a$ and $2b$.

$$\hbar\omega_p = E_{ai} - E_{av} - \delta_a \quad (3\text{-}1)$$

$$\hbar\omega_p = E_{bi} - E_{bv} - \delta_b \quad (3\text{-}2)$$

where, $\delta_a$ and $\delta_b$ denote detuning energies which are expressed as follows.

$$\delta_a << (E_{ai} - E_{av}) \quad (4\text{-}1)$$

$$\delta_b << (E_{bi} - E_{bv}) \quad (4\text{-}2)$$

By the light irradiation as mentioned above, carriers are virtually excited from the valence bands of the well layers $2a$ and $2b$. Energy levels of conduction band carriers of the electron waves which propagate in the well layers $2a$ and $2b$ are shifted from $E_{ai}$ to $E_{af}$ and from $E_{bi}$ to $E_{bf}$ by the exchange interaction with the excited virtual carriers, respectively. At this time, since the well layers have the inclined band structures, as the energy levels are shifted, the peak positions of the wave functions are also shifted. That is, by the light irradiation, the wave functions $\psi_{ai}$ and $\psi_{bi}$ are changed to the wave functions $\psi_{af}$ and $\psi_{bf}$. Thus, the channel distance d which is defined by the equation (2) changes.

Now, assuming that a channel distance when no light is irradiated is set to $d_i$ and a channel distance when the light has been irradiated is set to $d_f$, the transmission coefficient $|T|^2$ when the light has been irradiated is expressed as follows.

$$|T|^2 = \cos^2\left(\frac{e}{\hbar} \cdot \frac{d_f \cdot l}{2} \cdot B\right) \quad (5)$$
$$= \cos^2\left\{\frac{e}{\hbar} \cdot \frac{d_i \cdot l}{2} \cdot B \cdot \left(1 + \frac{\delta d}{d_i}\right)\right\}$$

where, $\delta d = d_f - d_i$. The equation (5) denotes that an effect which is obtained by irradiating a pump light into the device is equivalent to an effect which is obtained when the intensity of magnetic field is increased by $(1 + \delta d/d_i)$ times. That is, it will be understood that by the light irradiation, the transmission coefficient can be changed and the interference current can be controlled.

As a structure suitable to change the channel distance d, a structure in which the band gaps of the semiconductor layers constructing the channels are inclined in the opposite directions as in the foregoing example, that is, a structure in which the well layers $2a$ and $2b$ are symmetrical with respect to the barrier layer $5b$ as a center is particularly effective. However, the invention is not limited to such a structure. If the potential shape of at least one of the quantum well layers has an inclined structure, the channel interval can be changed.

(II) Method using the optical Stark effect

By irradiating the light having an energy which is close to an energy difference between two quantum levels of quantum well structures of semiconductor layers, that is, which is slightly smaller or slightly larger than such an energy difference to such semiconductor layers, a mixing occurs between the two levels and the energy level in the base state is shifted. In addition, a part of the wave function in the exciting state is mixed into the wave function in the base state. Such a phenomenon is called an optical Stark effect. An example in which the channel interval is changed by using the optical Stark effect will now be explained.

Figure 6:
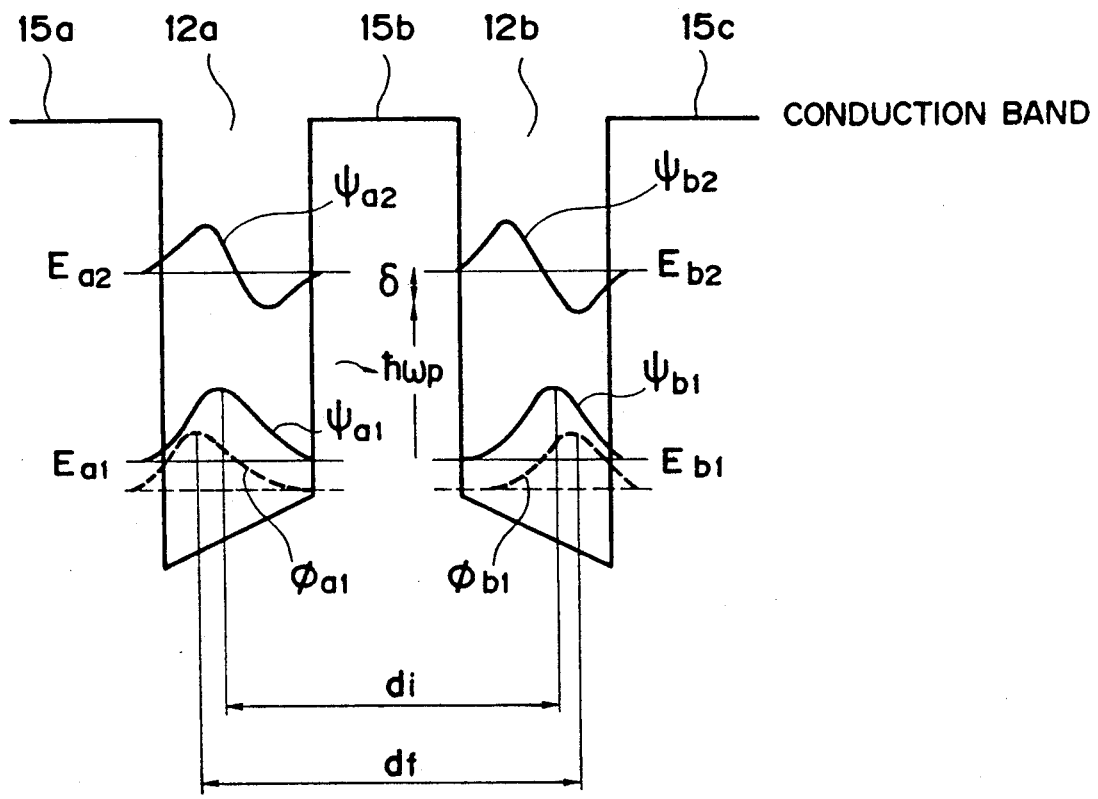
FIG. 6 is a diagram showing a first example of an energy band structure of channels in the device of the invention.

FIG. 6 shows an energy band diagram of semiconductor layers in the case where the channels of the device in FIG. 4 are constructed by semiconductor layers having a quantum well structure. In FIG. 6, reference numerals 12a and 12b denote quantum well layers constructing the channels 1a and 1b in FIG. 4, respectively. Barrier layers 15a, 15b, and 15c having band gaps wider than those of the quantum well layers are provided between the quantum well layers and on both sides thereof. The well layers have inclined band structures in a manner similar to the example of FIG. 5.

A film thickness and a potential of each of the well layers are set to be thin and deep enough to cause a quantum size effect. Therefore, two quantum levels $E_{a1}$ and $E_{a2}$ exist in the well layer 12a. Similarly, two quantum levels $E_{b1}$ and $E_{b2}$ exist in the well layer 12b.

A pump light having a photon energy $\hbar\omega_p$ which satisfies the following conditions is irradiated to the well layers.

$$\hbar\omega_p = E_{a2} - E_{a1} - \delta_a \quad (6\text{-}1)$$

$$\hbar\omega_p = E_{b2} - E_{b1} - \delta_b \quad (6\text{-}2)$$

$$\delta_a << (E_{a2} - E_{a1}) \quad (7\text{-}1)$$

$$\delta_b << (E_{b2} - E_{b1}) \quad (7\text{-}2)$$

Thus, wave functions $\psi_{1a}$ and $\psi_{1b}$ in the base state of the quantum wells are respectively changed to the following functions $\phi_{1a}$ and $\phi_{1b}$ by the perturbation due to the photoelectric field.

$$\phi_{a1} = \frac{1}{(1 + c_a^2)^{\frac{1}{2}}} \cdot (\psi_{a1} - \psi_{a2}) \quad (8\text{-}1)$$

$$\phi_{b1} = \frac{1}{(1 + c_b^2)^{\frac{1}{2}}} \cdot (\psi_{b1} - \psi_{b2}) \quad (8\text{-}2)$$

where, $c_a$ and $c_b$ are expressed as follows.

$$c_a = V_{21}/(E_{a1} - E_{a2}) \quad (9\text{-}1)$$

$$cb = V'_{21}/(E_{b1} - E_{b2}) \quad (9\text{-}2)$$

$V_{21}$ and $V'_{21}$ denote matrix elements of the perturbed potentials by the photoelectric field and are obtained as follows.

$$V_{21} = \int \psi_{a2}^{*} (e \cdot z \cdot \epsilon) \psi_{a1} dz \quad (10\text{-}1)$$

$$V'_{21} = \int \psi_{b2}^{*} (e \cdot z \cdot \epsilon) \psi_{b1} dz \quad (10\text{-}2)$$

where, $\epsilon$ denotes a photoelectric field.

As will be understood from the equations (8-1) and (8-2), the wave functions in the base state are deformed by the photoelectric field and the peak positions are shifted in the opposite directions for the well layers 12a and 12b. Thus, as already described in the equation (5), the channel interval d is changed and the interference current can be controlled.

In the case of using the optical Stark effect as in the embodiment, the inclined band structure as shown in FIG. 6 is not always an inevitable requirement. However, by using the inclined band structure, the channel interval d can be more effectively changed.

Figure 7:
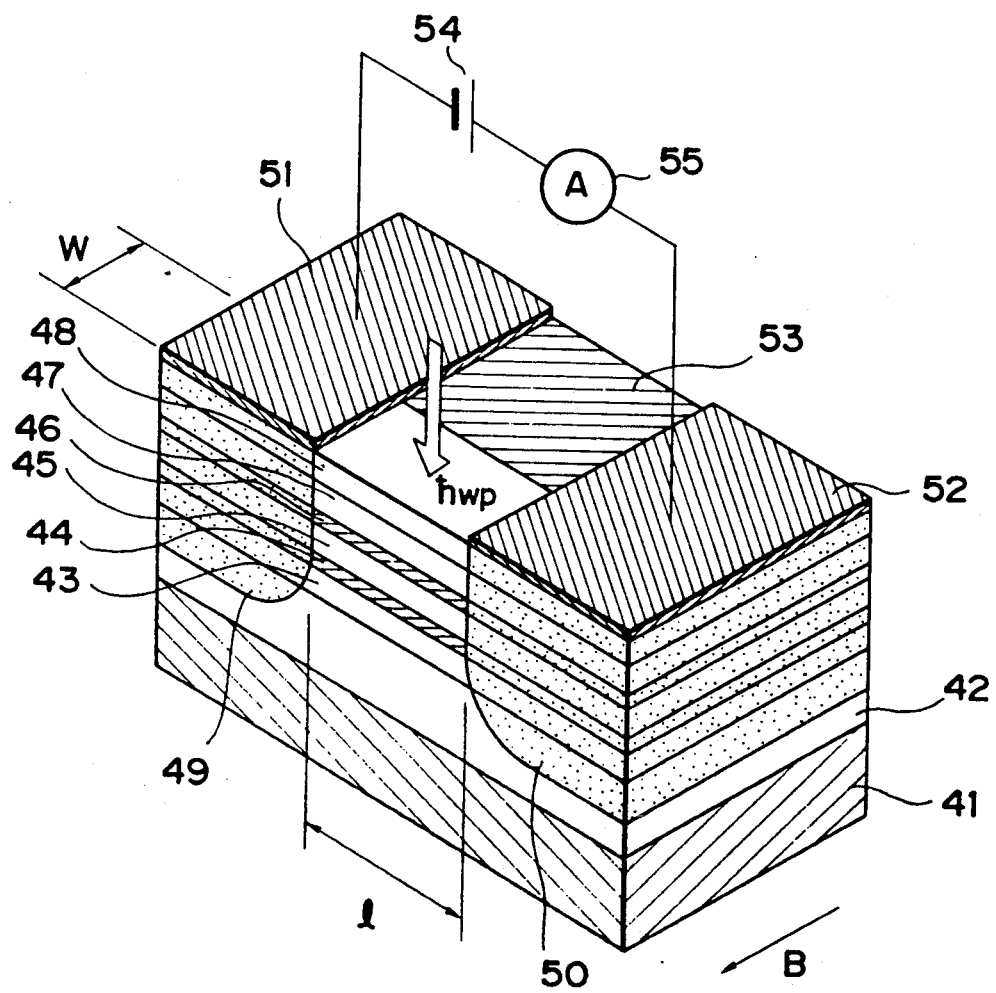
FIG. 7 is a schematic perspective view showing an embodiment of an electron wave interference device of the invention.

FIG. 7 is a schematic perspective view showing an embodiment of a quantum interference device of the invention. The device has been manufactured in the following manner.

First, a GaAs buffer layer 42 having a thickness of 0.5 μm, an n-AlAs barrier layer 43 having a thickness of 500 Å, an AlGaAs quantum well layer 44 having a thickness of 100 Å, an n-AlAs barrier layer 45 having a thickness of 200 Å, an AlGaAs quantum well layer 46 having a thickness of 100 Å, and an n-AlAs barrier layer 47 having a thickness of 500 Å were sequentially grown on a semiinsulative GaAs substrate 41 by using the molecular beam epitaxy (MBE) method or the organic metal chemical vapor phase deposition (MO-CVD) method. Further, to prevent the oxidation of the surface, an n+-GaAs cap layer 48 having a thickness of 500 Å was grown on the barrier layer 47. Si ions of a density of about $10^{17}$ to $10^{18}$ cm$^{-3}$ were selectively doped into the barrier layers 43, 45, and 47. Two-dimensional electron gases (2DEG) having a concentration of $10^{10}$ to $10^{11}$ cm$^{-3}$ were accumulated in the quantum well layers 44 and 46 by such doping.

Electrodes 51 and 52 made of Au/Ge films were formed in both edge portions of the semiconductor layers which had been laminated as mentioned above. After that, the laminate formed with the electrodes was thermally treated, the Au/Ge films were diffused, and electrode sections 49 and 50 were formed. The electrode sections 49 and 50 are used as a source portion and a drain portion, respectively. A portion between the electrode sections 49 and 50 is used as a gate portion. The quantum well layers 44 and 46 in the gate portion are used as first and second channels to propagate the electron waves between the electrode sections. A length l of each of the channels was set to 2 μm. To limit the channel widths, hydrogen ions were injected into a part of the portion in the direction which crosses perpendicularly to the propagating direction of the electron waves, thereby forming an insulating region 53. As mentioned above, a channel width W was set to 0.5 μm.

Figure 8:
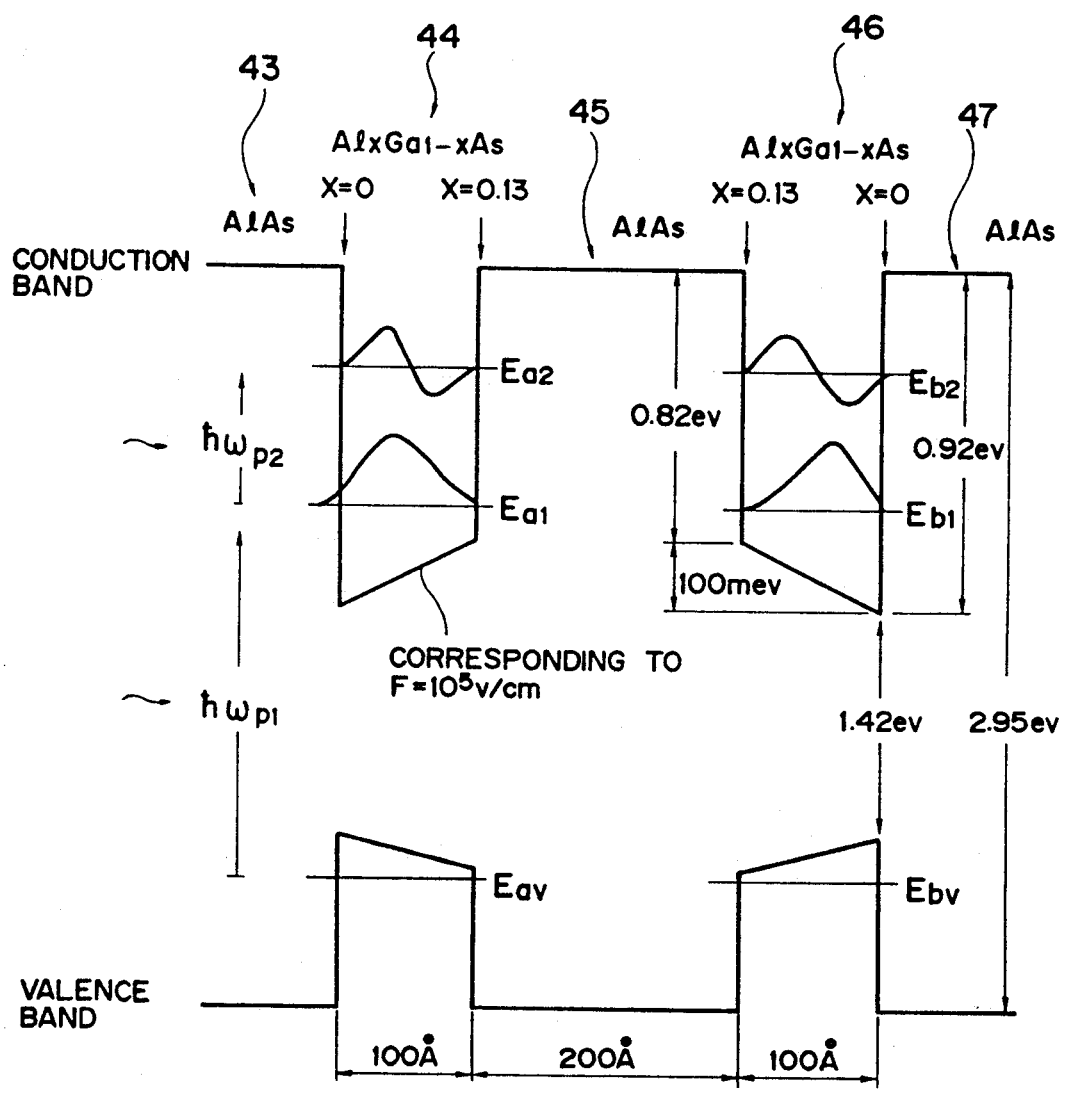
FIG. 8 is a diagram showing an energy band structure around a well layer in the device of FIG. 7.

FIG. 8 is a diagram showing energy levels near the channels of the foregoing device. The portions showing the energies of the respective layers are designated by the same reference numerals as those in FIG. 7. The band gaps of the quantum well layers 44 and 46 gradually change in the thickness direction of the layers. Those layers have the inclined band structure as shown in FIG. 8. The energy bands of the well layers 44 and 46 are inclined in the opposite directions. That is, the band gaps of the well layers 44 and 46 are formed so as to be gradually widened from the near side to the remote side. Such a band structure is formed by changing the compositions of the well layers 44 and 46. The well layers 44 and 46 were made of $Al_xGa_{1-x}As$ and the composition ratio x of Al was continuously changed in the thickness direction. The composition ratio x was set to 0.13 at the interface with the barrier layer 45 and was set to 0 at the interfaces with the barrier layers 43 and 47.

In the above construction, the well layers 44 and 46 have an energy difference of 100 meV at both ends. Such an energy difference is effectively equivalent to that an electric field F of $10^5$ V/cm has been applied to the thickness direction of the layers.

Figure 9:
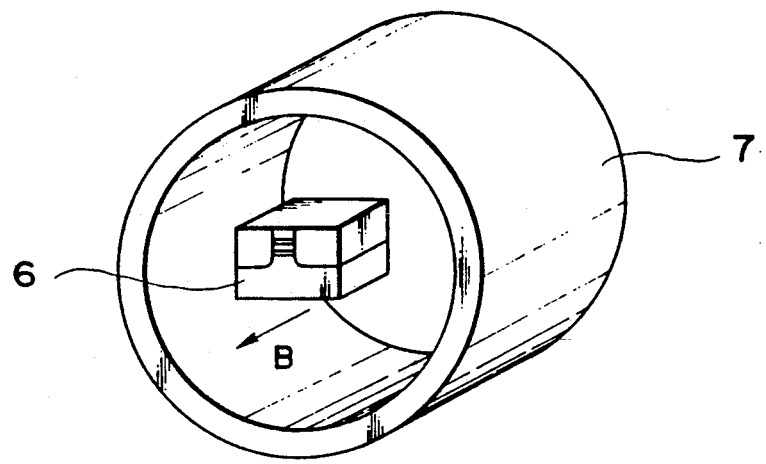
FIG. 9 is a schematic cross-sectional view showing an example of means for applying a magnetic field to the device of the invention.

The driving of the device of FIG. 7 will now be explained. In FIG. 7, a voltage is applied between the electrodes 51 and 52 by a power source 54. The electron waves are propagated from the electrode section 49 to the electrode section 50 through the well layers 44 and 46, respectively. A magnetic field B has been applied to the device from the outside. For instance, as shown in a perspective view of FIG. 9, such a magnetic field can be obtained by arranging a device 6 into a space in a cylindrical permanent magnet 7. When a light having the photon energy $\hbar\omega_p$ is irradiated to the well layers 44 and 46, a distance between the peaks of the wave functions of the electron waves which propagate in those layers is changed due to the exchange interaction or the optical Stark effect as described above, so that an amount of current flowing between the electrode sections 49 and 50 changes. Such a change in current amount is detected by an ammeter 55 connected to the electrodes.

For instance, as shown in FIG. 8, when a light having a wavelength of about 0.8 μm and a photon energy of $\hbar\omega_{p1}$ which is close to an energy difference between the quantum levels $E_{av}$ and $E_{bv}$ in the valence bands of the well layers 44 and 46 and the quantum levels $E_{a1}$ and $E_{b1}$ in the conduction bands thereof is irradiated to the well layers 44 and 46, the wave functions of the electron waves are deformed mainly by the exchange interaction of the conduction carrier and the virtual carrier.

On the other hand, when light having a wavelength of about 10 μm and a photon energy $\hbar\omega_{p2}$ which is closed to an energy difference between the base levels $E_{a1}$ and $E_{b1}$ in the condution bands of the well layers 44 and 46 and the first excitation levels $E_{a2}$ and $E_{b2}$ is irradiated to the well layers 44 and 46, the wave functions of the electron waves are deformed mainly by the optical Stark effect. By irradiating an enough strong light, the change δd in interval between the peak positions of the wave functions shown in the equation (5) can be set to about 15 Å. In the embodiment, since an interval $d_i$ between the peak positions of the wave functions when no light is irradiated is equal to about 300 Å, an effect similar to the effect when the effective magnetic field has been modulated by 5% by the light irradiation is obtained by the equation (5).

Figure 3:
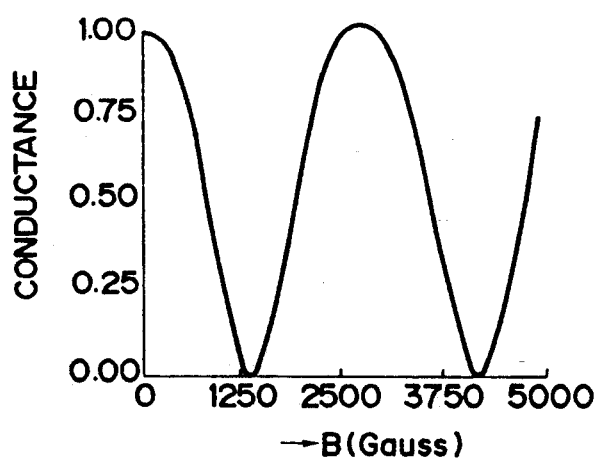
FIG. 3 is a diagram showing the relation between the intensity of an applied magnetic field and the conductance in the second conventional example of FIG. 2.

As shown in FIG. 3, the interference current is expressed by a periodic function of the magnetic field. An intensity $B_0$ of the magnetic field at which the current is equal to 0 is derived as follows by the equation (1

$$B_0 = (2n + 1) \cdot \frac{\hbar}{e} \cdot \frac{\pi}{l \cdot d_i} \quad (11)$$

).
where, n is an integer.

By substituting l=2 μm and $d_i$=300 Å into the equation (11), $B_0$=(2n+1)×343 Gauss. Assuming that n=10, $B_0$=7203 Gauss. That is, in the device of FIG. 7, when the external magnetic field B is set to 7203 Gauss, no current flows between the electrode sections 49 and 50 when no light is irradiated. On the other hand, when the light is irradiated to the well layers 44 and 46, the effective magnetic field is changed by 5%, namely, by 360 Gauss and an amount of current flowing between the electrode sections becomes maximum. By using the light which is irradiated as a light to be detected and by monitoring an amount of current flowing between the electrode sections by the ammeter 55, the device of the invention can be used as a photodetector.

Figure 10:
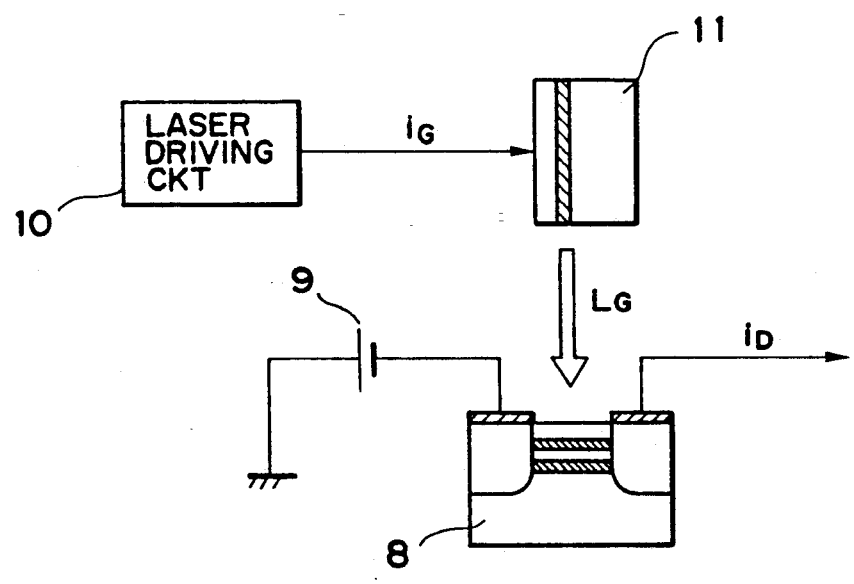
FIG. 10 is a schematic diagram showing an apparatus for modulating a current by using the device of the invention.

The invention can be also applied to an apparatus for controlling a current by a light. Such an example will be described by FIG. 10. In FIG. 10, reference numeral 8 denotes a device as shown in FIG. 7. A voltage is applied across electrodes of the device 8 by a power source 9. A gate light $L_G$ is irradiated to the device 8 from a laser light source 11 such as a semiconductor laser or the like. By modulating the light $L_G$ by a current $i_G$ which is supplied from a laser driving circuit 10 to the laser light source, a drain current $i_D$ of the device 8 is modulated. Assuming that the gate light $L_G$ is a pulse light having a pulse width of 1 psec or less, the drain current $i_D$ can be modulated at such a speed and a high speed current modulator can be realized.

Figure 11:
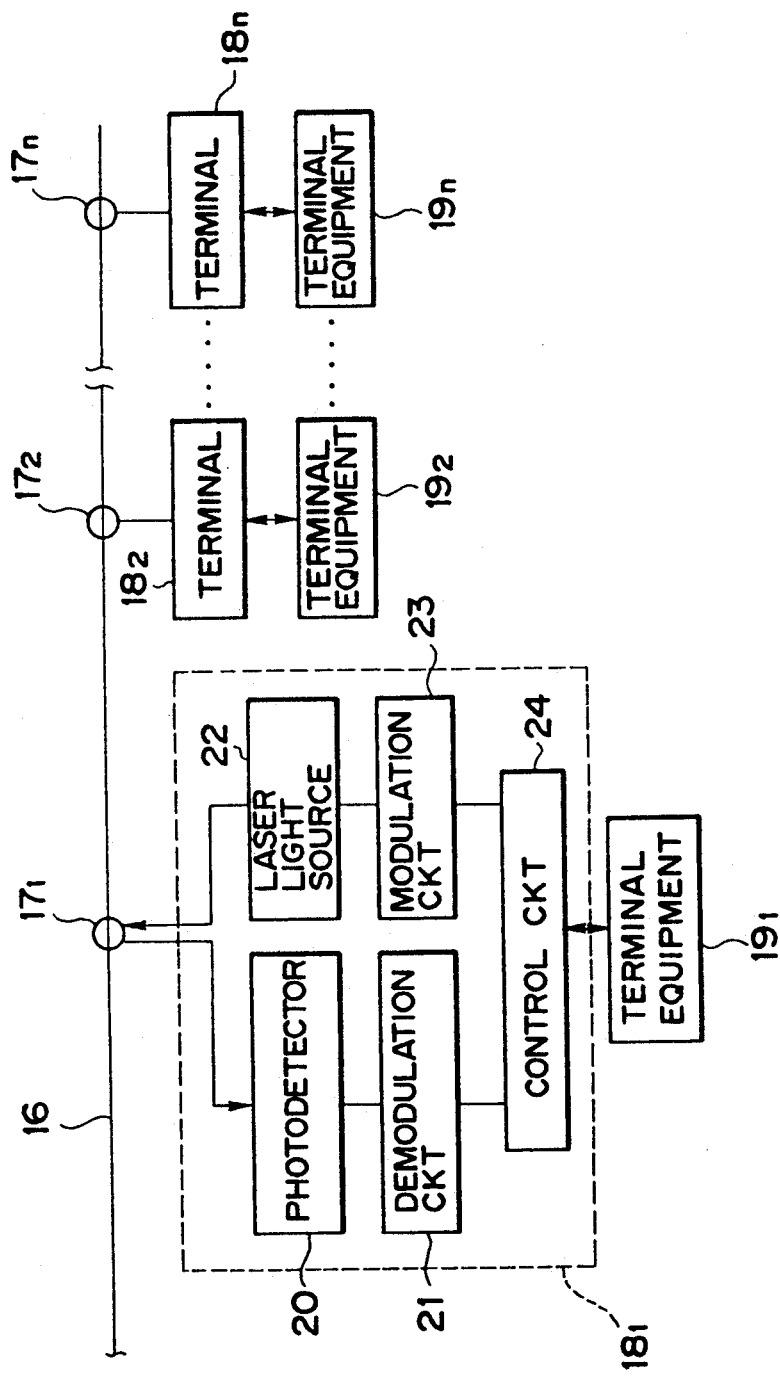
FIG. 11 is a block diagram showing an example of a light communication system using the device of the invention as a photodetector.

FIG. 11 is a block diagram for explaining an example in which the electron wave interference device of the invention is used as a photodetector of a light communication system. In FIG. 11, reference numeral 16 denotes an optical fiber to transmit a photo signal. A plurality of terminals $18_1, 18_2, \ldots, 18_n$ are connected to the optical fiber 16 through optical nodes $17_1, 17_2, \ldots, 17_n$, respectively. Terminal equipment $19_1, 19_2, \ldots, 19_n$ each having a keyboard, a display device, and the like are connected to the terminals.

Each terminal has a photo signal transmitter comprising a modulation circuit 23 and a laser light source 22. Each terminal has a photo signal receiver comprising a photodetector 20 and a demodulation circuit 21. The transmitter and the receiver are controlled by a control circuit 24 on the basis of commands from the terminal equipment $19_1$. The electron wave interference device of the invention as described in FIG. 7 can be preferably used as a photodetector 20.

The invention is not limited to the embodiments described above but many various applications are possible. For instance, although the device has been manufactured by using A(As and A(GaAs in the above embodiments, it can be also manufactured by using other III-V group semiconductors such as InGaAs or the like. The device of the invention can be also manufactured by using II-VI group semiconductors such as ZnMnSe, CdMnTe, etc. or I-VII group semiconductors such as CuCl or the like. The invention incorporates all of such application examples without departing from the scope of the claims of the invention.

What is claimed is:

1. An electron wave interference device which is controlled by a light, comprising:
    a first channel for propagating a first electron wave;
    a second channel for propagating a second electron wave and arranged at a predetermined distance from said first channel;
    a region for separating said first and second channels at a predetermined distance, said first and second channels arranged sandwiching said region; and
    means for applying a transverse magnetic field to said first and second channels and said region,
    wherein the first and second electron waves which respectively propagate in said first and second channels mutually interfere, and wherein when the light irradiates said first and second channels, a distance between peaks of wave functions of the first and second electron waves which propagate in said first and second channels changes, so that a phase difference occurs between the first and second electron waves.

2. A device according to claim 1, wherein said first and second channels comprise first and second semiconductor layers, said region, said first semiconductor layer and second semiconductor layer defining a quantum well and a band gap of at least one of said first and second semiconductor layers varies in a depth direction of said at least one semiconductor layer.

3. A device according to claim 2, wherein band gaps of said first and second semiconductor layers are widened from a side adjacent said region to a respective side opposite said region.

4. A device according to claim 2, wherein the light irradiating said first and second channels has a photon energy which is smaller than a difference between a first energy of a quantum level existing in a conduction band of said first and second semiconductor layers and a second energy of a quantum level existing in a valence band, and wherein by irradiating the light, a virtual carrier is generated in each of said first and second semiconductor layers and the first energy of the quantum level is shifted by an exchange interaction between the virtual carrier and first and second electron waves.

5. A device according to claim 2, wherein the following conditions are satisfied:

$$\hbar\omega_p = E_{ai} - E_{av} - \delta_a$$

$$\hbar\omega_p = E_{bi} - E_{bv} - \delta_b$$

$$\delta_a < (E_{ai} - E_{av})$$

$$\delta_b < (E_{bi} - E_{bv})$$

where,
$E_{ai}$: energy of a quantum level existing in a conduction band of said first semiconductor layer,
$E_{av}$: energy of a quantum level existing in a conduction band of said second semiconductor layer,
$E_{bv}$: energy of a quantum level existing in a valence band of said second semiconductor layer,
$\hbar\omega_p$: photon energy of the light irradiating said first and second semiconductor layers, and
$\delta_a$ and $\delta_b$: detuning energies.

6. A device according to claim 1, wherein said first and second channels comprise first and second semiconductor layers, said region, said first semiconductor layer and said second semiconductor layer defining a quantum well having first and second quantum levels of different energies in a conduction band of at least one of said first and second semiconductor layers.

7. A device according to claim 6, wherein the light irradiating said first and second channels has a photon energy which is not equal to a difference between the energy of the first quantum level and the energy of the second quantum level, and wherein when the light is irradiated, wave functions of the first and second electron waves which propagate in said first and second channels are deformed by an optical Stark effect.

8. A device according to claim 7, wherein band gaps of said first and second semiconductor layers vary in a thickness direction of said first and second semiconductor layers, and wherein when the light is irradiated, the energy of the quantum level is shifted by the optical Stark effect.

9. A device according to claim 8, wherein band gaps of said first and second semiconductor layers are widened from a side adjacent said region to a respective side opposite said region.

10. A device according to claim 6, wherein the following conditions are satisfied:

$$\hbar\omega_p = E_2 - E_1 - \delta$$

$$\delta < (E_2 - E_1)$$

where,
$E_1$: energy of the first quantum level,
$E_2$: energy of the second quantum level,
$\hbar\omega_p$: photon energy of the light irradiating said first and second semiconductors, and
$\delta$: detuning energy.

11. A method of controlling a propagation of first and second electron waves by using a device having first and second channels which are separated by a region at a predetermined distance, the first and second channels sandwiching the region, and respectively propagate the first and second electron waves, said method comprising the steps of:
propagating respectively the first and second electron waves in the first and second channels, in which the first and second electron waves mutually interfere;
applying a transverse magnetic field to the first and second channels and the region; and
irradiating the first and second channels with the light,
wherein when the light is irradiated, a distance between peaks of wave functions of the first and second electron waves which propagate in the first and second channels changes, so that a phase difference occurs between the first and second electron waves and transmission coefficients of the electron waves change.

12. A method according to claim 11, wherein the first and second channels comprise first and second semiconductor layers, the region, the first semiconductor layer and the second semiconductor layer defining a quantum well, a band gap of at least one of the first and second semiconductor layers vary in a thickness direction of the first and second semiconductor layers, the light irradiating said first and second channels has a photon energy which is smaller than a difference between an energy of a quantum level existing in a conduction band of the first and second semiconductor layers and an energy of a quantum level existing in a valence band thereof, and wherein when the light is irradiated, a virtual carrier is generated in each of the quantum level is shifted by an exchange interaction between the virtual carrier and the first and second electron waves.

13. A method according to claim 11, wherein the first and second channels comprise first and second semiconductor layers, the region, the first semiconductor layer and the second semiconductor layer defining a quantum well and a band gap of at least one of the first and second semiconductor layers varies in a depth direction of the first and second semiconductor layers and the following conditions are satisfied:

$$\hbar\omega_p = E_{ai} - E_{av} - \delta_a$$

$$\hbar\omega_p = E_{bi} - E_{bv} - \delta_b$$

$$\delta_a < (E_{ai} - E_{av})$$

$$\delta_b < (E_{bi} - E_{bv})$$

where,
- $E_{ai}$: energy of a quantum level existing in a conduction band of the first semiconductor layer,
- $E_{av}$: energy of a quantum level existing in a valence band of the first semiconductor layer,
- $E_{bi}$: energy of a quantum level existing in a conduction band of the second semiconductor layer,
- $E_{bv}$: energy of a quantum level existing in a valence band of the second semiconductor layer,
- $\hbar\omega_p$: photon energy of the light irradiating the first and second semiconductor layers, and
- $\delta_a$ and $\delta_b$: detuning energies.

14. A method according to claim 11, wherein the first and second channels comprise first and second semiconductor layers, the region, the first semiconductor layer and the second semiconductor layer defining a quantum well having first and second quantum levels of different energies in a conduction band of at least one of the first and second semiconductor layers, wherein the light irradiating the first and second channels has a photon energy which is not equal to a difference between an energy of the first quantum level and an energy of the second quantum level, and wherein when the light is irradiated, wave functions of the electron waves which propagate in the first and second channels are deformed by an optical Stark effect.

15. A method according to claim 14, wherein band gaps of the first and second semiconductor layers vary in a thickness direction of the first and second semiconductor layers, and wherein when the light is irradiated, the energy of the first quantum level is shifted by the optical Stark effect.

16. A method according to claim 11, wherein the first and second channels comprise first and second semiconductor layers, the region, the first semiconductor layer and the second semiconductor layer defining a quantum well having first and second quantum levels of different energies in a conduction band of at least one of the first and second semiconductor layers, and the following conditions are satisfied:

$$\hbar\omega_p = E_2 - E_1 - \delta$$

$$\delta < (E_2 - E_1)$$

where,
- $E_1$: energy of the first quantum level,
- $E_2$: energy of the second quantum level,
- $\hbar\omega_p$: photon energy of the light irradiating the first and second semiconductors, and
- $\delta$: detuning energy.

17. An electron wave interference device which is controlled by a light, comprising:
- a semiconductor member comprising a source portion, a gate portion, and a drain portion;
- a first channel for propagating a first electron wave from said source portion to said drain portion through said gate portion;
- a second channel arranged at a predetermined distance from said first channel and for propagating a second electron wave from said source portion to said drain portion through said gate portion, in which the first and second electron waves respectively propagate in said first and second channels mutually interfere;
- a region for separating said first and second channels at a predetermined distance, said first and second channels arranged sandwiching said region;
- means for applying a voltage between said source portion and said drain portion; and
- means for applying a transverse magnetic field to said first and second channels and said region,
- wherein when the light irradiates said first and second channels, a distance between peaks of wave functions of the first and second electron waves which propagate in said first and second channels changes, so that a phase difference occurs between the first and second electron waves and an amount of current flowing between said source portion and said drain portion changes.

18. A device according to claim 17, wherein said first and second channels comprise first and second semiconductor layers, said region, said first semiconductor layer and said second semiconductor layer define a quantum well and a band gap of at least one of said first and second semiconductor layers varies in a depth direction of said at least one semiconductor layer.

19. A device according to claim 18, wherein band gaps of said first and second semiconductor layers are widened from a side adjacent said region to a respective side opposite said region.

20. A device according to claim 18, wherein the light irradiating said first and second channels has a photon energy which is smaller than a difference between a first energy of a quantum level existing in a conduction band of said first and second semiconductor layers and a second energy of a quantum level existing in a valence band, and wherein by irradiating the light, a virtual carrier is generated in each of said first and second semiconductor layers and the first energy of the quantum level is shifted by an exchange interaction between the virtual carrier and the first and second electron waves.

21. A device according to claim 18, wherein the following conditions are satisfied:

$$\hbar\omega_p = E_{ai} - E_{av} - \delta_a$$

$$\hbar\omega_p = E_{bi} - E_{bv} - \delta_b$$

$$\delta_a < (E_{ai} - E_{av})$$

$$\delta_b < (E_{bi} - E_{bv})$$

where,
- $E_{ai}$: energy of a quantum level existing in a conduction band of said first semiconductor layer, $E_{av}$: energy of a quantum level existing in a valence band of said first semiconductor layer, $E_{bi}$: energy of a quantum level existing in a conduction band of said second semiconductor layer, $E_{bv}$: energy of a quantum level existing in a valence band of said second semiconductor layer, $\hbar\omega_p$: photon energy of the light irradiating said first and second semiconductor layers, and $\delta_a$ and $\delta_b$: detuning energies.

22. A device according to claim 17, wherein said first and second channels comprise first and second semiconductor layers, said region, said first semiconductor layer and said second semiconductor layer defining a quantum well having first and second quantum levels of different energies in a conduction band of at least one of said first and second semiconductor layers.

23. A device according to claim 22, wherein the light irradiating said first and second channels has a photon energy which is not equal to a difference between the energy of the first quantum level and the energy of the second quantum level, and wherein when the light is irradiated, wave functions of the first and second electron waves which propagate in said first and second channels are deformed by an optical Stark effect.

24. A device according to claim 23, wherein band gaps of said first and second semiconductor layers vary in a thickness direction of said first and second semiconductor layers, and wherein when the light is irradiated, the energy of the first quantum level is shifted by the optical Stark effect.

25. A device according to claim 24, wherein band gaps of said first and second semiconductor layers are widened from a side adjacent said region to a respective side opposite said region.

26. A device according to claim 22, wherein the following conditions are satisfied:

$$\hbar\omega_p = E_2 - E_1 - \delta$$

$$\delta < (E_2 - E_1)$$

where, $E_1$: energy of the first quantum level, $E_2$: energy of the second quantum level, $\hbar\omega_p$: photon energy of the light irradiating said first and second semiconductors, and $\delta$: detuning energy.

27. A method of controlling a current flowing between a source portion and a drain portion by using a device having a semiconductor member including the source portion, a gate portion, a region and the drain portion, and first and second channels for respectively propagating electron waves from the source portion to the drain portion through the gate portion, the first and second channels arranged sandwiching the region, said method comprising the steps of:

applying a voltage between the source portion and the drain portion to thereby allow the electron waves to propagate in the first and second channels, in which the electron waves mutually interfere;

applying a transverse magnetic field to the first and second channels and the region; and irradiating the first and second channels with light, wherein when the light is irradiated, a distance between peaks of wave functions of the electron waves which propagate in the first and second channels changes, so that a phase difference occurs between the electron waves and an amount of current flowing between the source portion and the drain portion changes.

28. A method according to claim 27, wherein the first and second channels comprise first and second semiconductor layers, the region, the first semiconductor layer and the second semiconductor layer defining a quantum well, a band gap of at least one of the first and second semiconductor layers varies in a thickness direction of the at least one of the first and second semiconductor layers, wherein the light irradiating the first and second channels has a photon energy which is smaller than a difference between an energy of a quantum level existing in a conduction band of the first and second semiconductor layers and an energy of a quantum level existing in a valence band thereof, and wherein when the light is irradiated, a virtual carrier is generated in each of the semiconductor layers and the energy of the conduction band quantum level is shifted by an exchange interaction between the virtual carrier and the electron wave.

29. method according to claim 27, wherein the first and second channels comprise first and second semiconductor layers, the region, the first semiconductor layer and the second semiconductor layer defining a quantum well and a band gap of at least one of the first and second semiconductor layers varies in a depth direction of the layer and the following conditions are satisfied:

$$\hbar\omega_p = E_{ai} - E_{avg} - \delta_a$$

$$\hbar\omega_p = E_{bi} - E_{bv} - \delta_b$$

$$\delta_a < (E_{ai} - E_{av})$$

$$\delta_b < (E_{bi} - E_{bv})$$

where, $E_{ai}$: energy of a quantum level existing in a conduction band of the first semiconductor layer, $E_{av}$: energy of a quantum level existing in a valence band of the first semiconductor layer, $E_{bi}$: energy of a quantum level existing in a conduction band of the second semiconductor layer, $E_{bv}$: energy of a quantum level existing in a valence band of the second semiconductor layer, $\hbar\omega_p$: photon energy of the light irradiating the first and second semiconductor layers, and $\delta_a$ and $\delta_b$: detuning energies.

30. A method according to claim 27, wherein the first and second channels comprise first and second semiconductor layers, the region, the first semiconductor layer and the second semiconductor layer defining a quantum well having first and second quantum levels of different energies in a conduction band of at least one of the first and second semiconductor layers, the light irradiating the first and second channels has a photon energy which is not equal to a difference between an energy of the first quantum level and an energy of the second quantum level, and wherein when the light is irradiated, wave functions of the electron waves which propagate in the channels are deformed by an optical Stark effect.

31. A method according to claim 30, wherein band gaps of the first and second semiconductor layers vary in a thickness direction of the first and second semiconductor layers, and wherein when the light is irradiated, the energy of the first quantum level is shifted by the optical Stark effect.

32. A method according to claim 27, wherein the first and second channels comprise first and second semiconductor layers, the region, the first semiconductor layer and the second semiconductor layer defining a quantum well having first and second quantum levels of different energies in a conduction band of at least one of the first and second semiconductor layers, and the following conditions are satisfied:

$$\hbar\omega_p = E_2 - E_1 - \delta$$

$$\delta < (E_2 - E_1)$$

where,
- $E_1$: energy of a first quantum level,
- $E_2$: energy of the second quantum level,
- $\hbar\omega_p$: photon energy of the light irradiating said first and second semiconductors, and
- $\delta$: detuning energy.

33. An electron wave interference device comprising:
a substrate;
a semiconductor member comprising a plurality of semiconductor layers arranged on said substrate;
first and second electrode sections which are respectively provided in parts of said semiconductor member so as to be arranged opposing each other in a direction which is parallel with a surface of said substrate;
a first channel for propagating a first electron wave between said first and second electrode sections comprising a first semiconductor layer, said first semiconductor layer defining a quantum well having a band gap which varies in a thickness direction of said first semiconductor layer; and
a second channel for propagating a second electron wave between said first and second electrode sections comprising a second semiconductor layer which is laminated having a predetermined distance from said first semiconductor layer, and said second semiconductor layer defining a quantum well,
wherein the first and second electron waves which respectively propagate in said first and second channels mutually interfere, and wherein when a light irradiates said first and second channels in a state in which a transverse magnetic field has been applied to said first and second channels, a distance between peaks of wave functions of the first and second electron waves which respectively propagate in said first and second channels changes, so that a phase difference occurs between the first and second electron waves.

34. A device according to claim 33, wherein band gaps of said first and second semiconductor layers are widened from a side adjacent said region to a respective side opposite said region.

35. A device according to claim 33, wherein the light irradiating said first and second channels has a photon energy which is smaller than a difference between a first energy of a quantum level existing in a conduction band of said first and second semiconductor layers and a second energy of a quantum level existing in a valence band, and wherein by irradiating the light, a virtual carrier is generated in each of said first and second semiconductor layers and the first energy of the quantum level is shifted by an exchange interaction between said virtual carrier and the first and second electron waves.

36. A device according to claim 33, wherein the following conditions are satisfied:

$$\hbar\omega_p = E_{ai} - E_{av} - \delta_a$$

$$\hbar\omega_p = E_{bi} - E_{bv} - \delta_b$$

$$\delta < (E_{ai} - E_{av})$$

$$\delta_b < (E_{bi} - E_{bv})$$

where,
- $E_{ai}$: energy of a quantum level existing in a conduction band of said first semiconductor layer,
- $E_{av}$: energy of the quantum level existing in a valence band of said first semiconductor layer,
- $E_{bi}$: energy of a quantum level existing in a conduction band of said second semiconductor layer,
- $E_{bv}$: energy of a quantum level existing in a valence band of said second semiconductor layer,
- $\hbar\omega_p$: photon energy of the light irradiating said first and second semiconductor layers, and
- $\delta_a$ and $\delta_b$: detuning energies.

$$\hbar\omega_p = E_2 - E_1 - \delta$$

$$\delta < (E_2 - E_1)$$

where,
- $E_1$: energy of a first quantum level,
- $E_2$: energy of the second quantum level, and
- $\hbar\omega_p$: photon energy of the light.

37. A device according to claim 33, wherein first and second quantum levels of different energies exist in a conduction band of said first semiconductor layer, wherein the light irradiating said first and second channels has a photon energy which is not equal to a difference between an energy of the first quantum level and an energy of the second quantum level, and wherein when the light is irradiated, a wave function of the first electron wave which propagates in said first channel is deformed by an optical Stark effect.

38. A device according to claim 33, wherein first and second quantum levels of different energies exist in a conduction band of said first semiconductor layer and the following conditions are satisfied:

$$\hbar\omega_p = E_2 - E_1 - \delta$$

$$\delta < (E_2 - E_1)$$

where,
- $E_1$: energy of a first quantum level,
- $E_2$: energy of the second quantum level, $\hbar\omega_p$: photon energy of the light irradiating said first and second semiconductor layers, $\delta$: detuning energy.

39. A method of controlling an amount of current flowing between a first electrode section and a second electrode section by using a device comprising, a substrate, a semiconductor member comprising a plurality of semiconductor layers arranged on the substrate, the first and second electrode sections which are respectively provided in parts of the semiconductor member so as to be arranged opposing each other in a direction which is parallel with a surface of the substrate.

a first channel for propagating a first electron wave between the first and second electrode sections comprising a first semiconductor layer, the semiconductor layer a quantum well having a band gap which varies in a thickness direction of the first semiconductor layer, a second channel for propagating a second electron wave between the first and second electrode sections comprising a second semiconductor layer which is laminated having a predetermined distance from the first semiconductor layer, and the second semiconductor layer, the first electrode section and the second electrode section defining a quantum well, a region separating the first and second channels, the first and second channels sandwiching the region, said method comprising the steps of:

applying a voltage between the first and second electrode sections to thereby allow the first and second electron waves to respectively propagate in the first and second channels, in which the electron waves mutually interfere;

applying a transverse magnetic field to the first and second channels and the region; and irradiating the first and second channels with a light, wherein when the light is irradiated, a distance between peaks of wave functions of the electron waves which respectively propagate in the first and second channels changes, so that a phase difference occurs between the first and second electron waves and an amount of current flowing between the first and second electrode sections changes.

40. A method according to claim 39, wherein the light irradiating the first and second channels has a photon energy which is smaller than a difference between a first energy of a quantum level existing in a conduction band of the first and second semiconductor layers and a second energy of a quantum level existing in a valence band, and wherein by irradiating the light, a virtual carrier is generated in each of the first and second semiconductor layers and the first energy of the quantum level is shifted by an exchange interaction between the virtual carrier and the electron wave.

41. A method according to claim 39, wherein the following conditions are satisfied:

$$\hbar\omega_p = E_{ai} - E_{av} - \delta_a$$

$$\hbar\omega_p = E_{bi} - E_{bv} - \delta_b$$

$$\delta_a < (E_{ai} - E_{av})$$

$$\delta_b < (E_{bi} - E_{bv})$$

where, $E_{ai}$: energy of a quantum level existing in a conduction band of said first semiconductor layer, $E_{av}$: energy of the quantum level existing in a valence band of said first semiconductor layer, $E_{bi}$: energy of a quantum level existing in a conduction band of said second semiconductor layer, $E_{bv}$: energy of a quantum level existing in a valence band of said second semiconductor layer, $\hbar\omega_p$: photon energy of the light irradiating said first and second semiconductor layers, and $\delta_a$ and $\delta_b$: detuning energies.

42. A method according to claim 39, wherein first and second quantum levels of different energies exist in a conduction layers, wherein light irradiating the first and second channels has a photon energy which is not equal to a difference between an energy of the first quantum level and an energy of the second quantum level, and wherein when the light is irradiated, wave functions of the first and second electron waves which propagates in the first and second channels are deformed by an optical Stark effect.

43. A method according to claim 42, wherein band gaps of the first and second semiconductor layers vary in a thickness direction of the first and second semiconductor layers, and wherein when the light is irradiated, the energy of the first quantum level is shifted by the optical Stark effect.

44. A method according to claim 39, wherein first and second quantum levels of different energies exist in a conduction band of at least one of the first and second semiconductor layers and the following conditions are satisfied:

$$\hbar\omega_p = E_2 - E_1 - \delta$$

$$\delta < (E_2 - E_2)$$

where, $E_1$: energy of the first quantum level, $E_2$: energy of the second quantum level, $\hbar\omega_p$: photon energy of the light irradiating said first and second semiconductors, and $\delta$: detuning energy.

45. An electron wave interference device comprising:

a substrate;

a semiconductor member comprising a plurality of semiconductor layers arranged on said substrate;

first and second electrode sections which are respectively provided in parts of said semiconductor member so as to be arranged opposing each other in a direction which is parallel with a surface of said substrate;

a first channel for propagating a first electron wave between said first and second electrode sections comprising a first semiconductor layer, said first semiconductor layer defining a quantum well having first and second quantum levels of different energies in a conduction band;

a second channel for propagating a second electron wave between said first and second electrode sections comprising a second semiconductor layer which is laminated having a predetermined distance from said first semiconductor layer and said second semiconductor layer defining a quantum well a region separating the first and second channels, the first and second channels sandwiching the region; and means for applying a transverse magnetic field to said first and second channels and said region, wherein first and second electron waves which respectively propagate in said first and second channels mutually interfere, and wherein when a light irradiates said first and second channels, a distance between peaks of wave functions of the first and second electron waves which propagate in said first and second channels changes, so that a phase difference occurs between the first and second electron waves.

46. A device according to claim 45, wherein the light irradiating said first and second channels has a photon energy which is not equal to a difference between an energy of the first quantum level and an energy of the second quantum level, and wherein when the light is irradiated, the wave functions of the first and second electron waves which propagate in said first and second channels are deformed by an optical Stark effect.

47. A device according to claim 46, wherein band gaps of said first and second semiconductor layers vary in a thickness direction of said first and second semiconductor layers, and wherein when the light is irradiated, the energy of the first quantum level is shifted by the optical Stark effect.

48. A device according to claim 45, wherein the following conditions are satisfied:

$$\hbar\omega_p = E_2 - E_2 - \delta$$

$$\delta < (E_2 - E_1)$$

where,
$E_1$: energy of the first quantum level,
$E_2$: energy of the second quantum level,
$\hbar\omega_p$: photon energy of the light irradiating said first and second semiconductor layers, and
$\delta$: detuning energy.

49. A method of controlling an amount of current flowing between a first electrode section and a second electrode section by using a device comprising,
a substrate,
a semiconductor member comprising a plurality of semiconductor layers arranged on the substrate,
the first and second electrode sections which are respectively provided in parts of said semiconductor member so as to be arranged opposing each other in a direction which is parallel with a surface of said substrate,
a first channel for propagating a first electron wave between the first and second electrode sections comprising a first semiconductor layer, the first channel means defining a quantum well having first and second quantum levels of different energies in a conduction band, and
a second channel for propagating a second electron wave between the first and second electrode sections comprising a second semiconductor layer which is laminated having a predetermined distance from the first semiconductor layer, said second semiconductor layer, said first electrode section and said second electrode section defining a quantum well, and a region separating the first and second channels, the first and second channels sandwiching the region, said method comprising the steps of:
applying a voltage between the first and second electrode sections to thereby allow the electron waves to respectively propagate in the first and second channels, in which said electron waves mutually interfere;
applying a transverse magnetic field to said first and second channels and the region; and
irradiating the first and second channels with light,
wherein when the light is irradiated, a distance between peaks of wave functions of the electron waves which respectively propagate in the first and second channels changes, so that a phase difference occurs between said electron waves and an amount of current flowing between the first and second electrode sections changes.

50. A method according to claim 49, wherein the light irradiating the first and second channels has a photon energy which is not equal to a difference between an energy of the first quantum level and an energy of the second quantum level, and wherein when the light is irradiated, the wave functions of the first and second electron waves which propagate in said channels are deformed by an optical Stark effect.

51. A device according to claim 49, wherein the following conditions are satisfied:

$$\hbar\omega_p = E_2 - E_2 - \delta$$

$$\delta < (E_2 - E_1)$$

where,
$E_1$: energy of the first quantum level,
$E_2$: energy of the second quantum level,
$\hbar\omega_p$: photon energy of the light irradiating said first and second semiconductors, and
$\delta$: detuning energy.

52. An electron wave interference device comprising:
a substrate;
a first barrier layer arranged on said substrate;
a first quantum well layer arranged on said first barrier layer and comprises a first channel for propagating a first electron wave and having a band gap varying in a thickness direction of said first barrier layer;
a second barrier layer arranged on said first quantum well layer;
a second quantum well layer arranged on said second barrier layer and comprising a second channel for propagating a second electron wave and having a band gap varying in a thickness direction of said second barrier layer;
a third barrier layer arranged on said second quantum well layer; and
first and second electrode sections provided in parts of said first and second quantum well layers to as to oppose each other in a propagating direction of the first and second electron waves.

53. A device according to claim 52, wherein said first, second, and third barrier layers comprise AlAs and wherein said first and second quantum well layers comprise AlGaAs having a composition ratio of Al continuously varying in a thickness direction.

54. A method controlling an amount of current flowing between a first electrode section and a second electrode section by using a device which comprises,
a substrate,
a first barrier layer arranged on the substrate;
a first quantum well layer arranged on the first barrier layer and comprises a first channel for propagating a first electron wave and having a band gap varying in a thickness direction of the first barrier layer,
a second barrier layer arranged on the first quantum well layer,
a second quantum well layer arranged on the second barrier layer and comprises a second channel for propagating a second electron wave and having a band gap varying in a thickness direction of the second barrier layer, a region separating the first and second channels, the first and second channels sandwiching the region,
a third barrier layer arranged on the second quantum well layer, and
the first and second electrode sections provided in parts of the first and second quantum well layers so as to oppose each other in a propagating direction of the first and second electron waves,
said method comprising the steps of:
applying a voltage between the first and second electrode sections to thereby allow the first and second electron waves to respectively propagate in the first and second channels, in which said electron waves mutually interfere;
applying a transverse magnetic field to the first and second channels and the region; and
irradiating the first and second channels with a light, wherein when the light is irradiated, a distance between peaks of wave functions of the electron waves which respectively propagate in the first and second channels changes, so that a phase difference occurs between the first and second electron waves and an amount of current flowing between the first and second electrode sections changes.

55. A method according to claim 54, wherein the light which irradiates the first and second channels has a photon energy which is smaller than a difference between a first energy of a quantum level existing in a conduction band of the first and second quantum well layers and a second energy of a quantum level existing in a valence band, and wherein by irradiating the light, a virtual carrier is generated in each of the quantum well layers and the first energy of the quantum level is shifted by and exchange interaction between the virtual carrier and the first and second electron waves.

56. A method according to claim 54, wherein the following conditions are satisfied:

$$\hbar\omega_p = E_{ai} - E_{av} - \delta_a$$

$$\hbar\omega_p = E_{bi} - E_{bv} - \delta_b$$

$$\delta < (E_{ai} - E_{av})$$

$$\delta_b < (E_{bi} - E_{bv})$$

where,
$E_{ai}$: energy of a quantum level existing in a conduction band of said first quantum layer,
$E_{av}$: energy of a quantum level existing in a valence band of the first quantum well layer,
$E_{bi}$: energy of a quantum level existing in a conduction band of the second quantum well layer,
$E_{bv}$: energy of a quantum level existing in a valence band of said second quantum well layer,
$\hbar\omega_p$: photon energy of the light irradiates first and second quantum well layers, and
$\delta_a$ and $\delta_b$: detuning energies.

57. A method according to claim 54, wherein first and second quantum levels of different energies exist in a conduction band of at least one of the first and second quantum well layers, wherein the light irradiating the quantum well layers has a photon energy which is not equal to a difference between an energy of the first quantum level, and wherein when the light is irradiated, wave functions of the first and second electron waves which propagate in the first and second channels are deformed by an optical Stark effect.

58. A method according to claim 54, wherein first and second quantum levels of different energies exist in a conduction band of at least one of the first and second quantum well layers, and the following conditions are satisfied:

$$\hbar\omega_p = E_2 - E_1 - \delta$$

$$\delta < (E_2 - E)$$

where,
$E_1$: energy of the first quantum level,
$E_2$: energy of the second quantum level,
$\hbar\omega_p$: photon energy of the light irradiating the first and second quantum well layers, and
$\delta$: detuning energy.

59. A photodetector comprising:
a semiconductor member comprising a source portion, a gate portion, and a drain portion,
a first channel for propagating a first electron wave from said source portion to said drain portion through said gate portion,
a second channel arranged at a predetermined distance from said first channel and for propagating a second electron wave from said source portion to said drain portion through said gate portion, in which the first and second electron waves respectively propagate in said first and second channels mutually interfere;
a region for separating said first and second channels, said first and second channels arranged sandwiching said region;
means for applying a voltage between said source portion and said drain portion;
means for applying a transverse magnetic field to said first and second channels and said region; and
means for detecting an amount of current flowing between said source portion and said drain portion, wherein when the light irradiates said first and second channels, a distance between peaks of wave functions of the first and second electron waves which propagate in said first and second channels changes, so that a phase difference occurs between the first and second electron waves and an amount of current flowing between said source portion and said drain portion changes.

60. A photodetector according to claim 59, wherein said first and second channels comprise first and second semiconductor layers, said region, said first semiconductor layer and said second semiconductor layer defining a quantum well, and a band gap of at least one of said first and second semiconductor layers varies in a thickness direction of said one semiconductor layer.

61. A photodetector according to claim 60, wherein band gaps of said first and second semiconductor layers are widened from a side adjacent to said region to a respective side opposite said region.

62. A photodetector according to claim 60, wherein the light irradiating said first and second channels has a photon energy which is smaller than a difference between a first energy of a quantum level existing in a conduction band of said first and second semiconductor layers and a second energy of a quantum level existing in a valence band, and wherein by irradiating the light, a virtual carrier is generated in each of said first and second semiconductor layers and the first energy of the quantum level is shifted by an exchange interaction between the virtual carrier and the first and second electron waves.

63. A photodetector according to claim 60, wherein the following conditions are satisfied:

$$\hbar\omega_p = E_{ai} - E_{av} - \delta_a$$

$$\hbar\omega_p = E_{bi} - E_{bv} - \delta_b$$

$$\delta < (E_{ai} - E_{av})$$

$$\delta_b < (E_{bi} - E_{bv})$$

where,
$E_{ai}$: energy of a quantum level existing in a conduction band of said first semiconductor layer,
$E_{av}$: energy of the quantum level existing in a valence band of said first semiconductor layer,
$E_{bi}$: energy of a quantum level existing in a conduction band of said second semiconductor layer,
$E_{bv}$: energy of a quantum level existing in a valence band of said second semiconductor layer,
$\hbar\omega_p$: photon energy of the light irradiating said first and second semiconductor layers, and
$\delta_a$ and $\delta_b$: detuning energies.

64. A photodetector according to claim 59, wherein said first and second channels comprise first and second semiconductor layers, said region, said first and second semiconductor layers defining quantum wells having first and second quantum levels of different energies in a conduction band of at least one of said first and second semiconductor layers.

65. A photodetector according to claim 64, wherein the light irradiating said first and second channels has a photon energy which is not equal to a difference between the energy of the first quantum level and the energy of the second quantum level, and wherein when the light is irradiated, wave functions of the electron waves which propagate in the first and second channels are deformed by an optical Stark effect.

66. A photodetector according to claim 65, wherein band gaps of said first and second semiconductor layers vary in a thickness direction of said first and second semiconductor layers, and wherein when the light is irradiated, the energy of the first quantum level is shifted by the optical Stark effect.

67. A photodetector according to claim 66, wherein bands gaps of said first and second semiconductor layers are widened form a side adjacent said region to a respective side opposite said region.

68. A photodetector according to claim 64, wherein the following conditions are satisfied:

$$\hbar\omega_p = E_2 - E_1 - \delta$$

$$\delta < (E_2 - E_1)$$

where,
$E_1$: energy of the first quantum level,
$E_2$: energy of the second quantum level,
$\hbar\omega_p$: photon energy of the light irradiating said first and second semiconductor layers, and
$\delta$: detuning energy.

69. A method of detecting a light by using a device comprising,
a semiconductor member comprising a source portion, a gate portion, and a drain portion,
a first channel for propagating a first electron wave from the source portion to the drain portion through the gate portion, and
a second channel arranged at a predetermined distance from the first channel and for propagating a second electron wave from the source portion to the drain portion through the gate portion,
a region for separating the first and second channels, the first and second channels arranged sandwiching the region,
said method comprising the steps of:
applying a voltage between the source portion and the drain portion to thereby allow the first and second electron waves to respectively propagate in said first and second channels, in which said electron waves mutually interfere;
applying a transverse magnetic field to the first and second channels and the region;
irradiating the first and second channels with a light for detection, wherein when the light is irradiated, a distance between peaks of wave functions of the electron waves which respectively propagate in the first and second channels changes, so that a phase difference occurs between the first and second electron waves; and
detecting a change in an amount of current flowing between the source portion and the drain portion which has occurred by the phase difference.

70. A method according to claim 69, wherein the first and second channels comprise first and second semiconductor layers, the region, the first and second semiconductor layers defining a quantum well, a band gap of at least one of the first and second semiconductor layers vary in a thickness direction of the one semiconductor layer, wherein the light irradiating the first and second channels has a photon energy which is smaller than a difference between a first energy of a quantum level existing in a conduction band of the first and second semiconductor layers and a second energy of a quantum level existing in a valence band thereof, and wherein when the light is irradiated, a virtual carrier is generated in each of the first and second semiconductor layers and the first energy of the quantum level is shifted by an exchange interaction between the virtual carrier and the first and second electron waves.

71. A method according to claim 69, wherein the first and second channels comprise first and second semiconductor layers, the region, the first and second semiconductor layers defining a quantum well and a band gap of at least one of said first and second semiconductor layers vary in a depth direction of the one semiconductor layer and the following conditions are satisfied:

$$\hbar\omega_p = E_{ai} - E_{av} - \delta_a$$

$$\hbar\omega_p = E_{bi} - E_{bv} - \delta_b$$

$$\delta_a < (E_{ai} - E_{av})$$

$$\delta_b < (E_{bi} - E_{bv})$$

where,
- $E_{ai}$: energy of a quantum level existing in a conduction band of the first semiconductor layer,
- $E_{av}$: energy of a quantum level existing in a valence band of the first semiconductor layer,
- $E_{bi}$: energy of a quantum level existing in a conduction band of the second semiconductor layer,
- $E_{bv}$: energy of a quantum level existing in a valence band of the second semiconductor layer,
- $\hbar\omega_p$: photon energy of the light irradiating the first and second semiconductor layers, and
- $\delta_a$ and $\delta_b$: detuning energies.

72. A method according to claim 69, wherein the first and second channels comprise first and second semiconductor layers, the region, the first and second semiconductor layers defining a quantum well having first and second quantum levels of different energies in a conduction band of at least one of the first and second semiconductor layers, wherein the light irradiating the first and second channels has a photon energy which is not equal to a difference between an energy of the first quantum level and an energy of the second quantum level, and wherein when the light is irradiated, wave functions of the first and second electron waves which propagate in the first and second channels are deformed by an optical Stark effect.

73. A method according to claim 72, wherein band gaps of the first and second semiconductor layers vary in a thickness direction of the first and second semiconductor layers, and wherein when the light is irradiated, the energy of the first quantum level is shifted by the optical Stark effect.

74. A method according to claim 69, wherein the first and second channels comprise first and second semiconductor layers, the region, the first and second semiconductor layers defining a quantum well having first and second quantum levels of different energies in a conduction band of at least one of the first and second semiconductor layers, and the following conditions are satisfied:

$$\hbar\omega_p = E_2 - E_1 - \delta$$

$$\delta < (E_2 - E_1)$$

where,
- $E_1$: energy of the first quantum level,
- $E_2$: energy of the second quantum level,
- $\hbar\omega_p$: photon energy of the light irradiating the first and second semiconductors, and
- $\delta$: detuning energy.

75. An apparatus for controlling a current by using a light, comprising:
- a semiconductor member comprising a source portion, a gate portion, and a drain portion,
- a first channel for propagating a first electron wave from said source portion to said drain portion through said gate portion,
- a second channel which is arranged at a predetermined distance from said first channel and for propagating a second electron wave from said source portion to said drain portion through said gate portion, in which the first and second electron waves which respectively propagate in said first and second channels mutually interfere;
- a region for separating said first and second channels, said first and second channels separating said region;
- means for applying a voltage between said source portion and said drain portion;
- means for applying a transverse magnetic field to said first and second channels and said region; and
- means for irradiating said first and second channels with the light,
- wherein when the light irradiates said first and second channels, a distance between peaks of wave functions of the first and second electron waves which propagate in said first and second channels changes, so that a phase difference occurs between the first and second electron waves and an amount of current flowing between said source portion and said drain portion changes.

76. An apparatus according to claim 75, wherein said first and second channels comprise first and second semiconductor layers, said region, said first and second semiconductor layers defining a quantum well, and a band gap of at least one of said first and second semiconductor layers varies in a depth direction of said one layer.

77. An apparatus according to claim 76, wherein band gaps of said first and second semiconductor layers are widened from a side adjacent said region to a respective side opposite said region.

78. An apparatus according to claim 75, wherein the light which irradiates said first and second channels has a photon energy which is smaller than a difference between a first energy of a quantum level existing in a conduction band of said first and second semiconductor layers and a second energy of a quantum level existing in a valence band, and wherein by irradiating the light, a virtual carrier is generated in each of said first and second semiconductor layers and the first energy of the quantum level is shifted by an exchange interaction between the virtual carrier and the first and second electron waves.

79. An apparatus according to claim 76, wherein the following conditions are satisfied:

$$\hbar\omega_p = E_{ai} - E_{av} - \delta_a$$

$$\hbar\omega_p = E_{bi} - E_{bv} - \delta_b$$

$$\delta < (E_{ai} - E_{av})$$

$$\delta_b < (E_{bi} - E_{bv})$$

where, $E_{ai}$: energy of a quantum level existing in a conduction band of said first semiconductor layer, $E_{av}$: energy of a quantum level existing in a valence band of said first semiconductor layer, $E_{bi}$: energy of a quantum level existing in a conduction band of said second semiconductor layer, $E_{bv}$: energy of a quantum level existing in a valence band of said second semiconductor layer, $\hbar\omega_p$: photon energy of the light irradiating said first and second semiconductor layers, and $\delta_a$ and $\delta_b$: detuning energies.

80. An apparatus according to claim 75, wherein said first and second channels comprise first and second semiconductor layers, said region, said first and second semiconductor layers defining a quantum well having first and second quantum levels of different energies in a conduction band of at least one of said first and second semiconductor layers.

81. An apparatus according to claim 80, wherein the light irradiating said first and second channels has a photon energy which is not equal to a difference between the energy of the first quantum level and the energy of the second quantum level, and wherein when the light is irradiated, wave functions of the electron waves which propagate in the channels are deformed by optical Stark effect.

82. An apparatus according to claim 81, wherein band gaps of said first and second semiconductor layers vary in a thickness direction of said first and second layers, and wherein when the light is irradiated, the energy of the first quantum level is shifted by the optical Stark effect.

83. An apparatus according to claim 82, wherein bands gaps of said first and second semiconductor layers are widened from a side adjacent said region to a respective side opposite said region.

84. An apparatus according to claim 80, wherein the following conditions are satisfied:

$$\hbar\omega_p = E_2 - E_1 - \delta$$

$$\delta < (E_2 - E_1)$$

where, $E_1$: energy of the first quantum level, $E_2$: energy of the second quantum level, $\hbar\omega_p$: photon energy of the light irradiating said first and second semiconductors, and $\delta$: detuning energy.

85. A light communication system comprising:

a light transmission path for transmitting a photo-signal; and a plurality of terminals connected to said light transmission path, wherein each of said terminals comprise a photo-signal transmitter for transmitting the photo-signal and a photodetector for detecting the photo-signal transmitted from the other ones of said plurality of terminals, and said photo-detector comprising:

a semiconductor member comprising a source portion, a gate portion, and a drain portion, a first channel for propagating a first electron wave from said source portion to said drain portion through said gate portion, a second channel arranged at a predetermined distance from said first channel and for propagating a second electron wave from said source portion to said drain portion through said gate portion, in which the first and second electron waves which respectively propagate in said first and second channels mutually interfere;

a region for separating said first and second channels, said first and second channels arranged sandwiching said region;

means for applying a voltage between said source portion and said drain portion;

means for applying a transverse magnetic field to said first and second channels and said region; and means for detecting an amount of current flowing between said source portion and said drain portion, and wherein when the light irradiates said first and second channels, a distance between peaks of wave functions of the first and second electron waves which propagate in said first and second channels changes, so that a phase difference occurs between the first and second electron waves and an amount of current flowing between said source portion and said drain portion changes.

86. A system according to claim 85, wherein said first and second channels comprise first and second semiconductor layers, said region, said first semiconductor layer and said second semiconductor layer defining a quantum well, and a band gap of at least one of said first and second semiconductor layers varies in a depth direction of said one semiconductor layer.

87. A system according to claim 86, wherein band gaps of said first and second semiconductor layers are widened from a side adjacent to said region to a respective side opposite said region.

88. A system according to claim 85, wherein the light irradiating said first and second channels has a photon energy which is smaller than a difference between a first energy of a quantum level existing in a conduction band of said first and second semiconductor layers and a second energy of a quantum level existing in a valence band, and wherein by irradiating the light, a virtual carrier is generated in each of said first and second semiconductor layers and the first energy of the quantum level is shifted by an exchange interaction between the virtual carrier and the first and second electron waves.

89. A system according to claim 86, wherein the following conditions are satisfied;

$$\hbar\omega_p = E_{ai} - E_{av} - \delta_a$$

$$\hbar\omega_p = E_{bi} - E_{bv} - \delta_b$$

$$\delta < (E_{ai} - E_{av})$$

$$\delta_b < (E_{bi} - E_{bv})$$

where,
- $E_{ai}$: energy of a quantum level existing in a conduction band of said first semiconductor layer,
- $E_{av}$: energy of the quantum level existing in a valence band of said first semiconductor layer,
- $E_{bi}$: energy of a quantum level existing in a conduction band of said second semiconductor layer,
- $E_{bv}$: energy of a quantum level existing in a valence band of said second semiconductor layer,
- $\hbar\omega_p$: photon energy of the light irradiating said first and second semiconductor layers, and
- $\delta_a$ and $\delta_b$: detuning energies.

90. A system according to claim 85, wherein said first and second channels comprise first and second semiconductor layers, said region, said first and second semiconductor layers defining a quantum well having first and second quantum levels of different energies in a conduction band of at least one of said first and second semiconductor layers.

91. A system according to claim 90, wherein the light which is irradiating said first and second channels has a photon energy which is not equal to a difference between the energy of the first quantum level and the energy of the second quantum level, and wherein when the light is irradiated, wave functions of the electron waves which propagate in the first and second channels are deformed by an optical Stark effect.

92. A system according to claim 91, wherein band gaps of said first and second semiconductor layers vary in a thickness direction of said first and second semiconductor layers, and wherein when the light is irradiated, the energy of the quantum level is shifted by the optical Stark effect.

93. A system according to claim 92, wherein band gaps of said first and second semiconductor layers are widened from a side adjacent said region to a respective side opposite said region.

94. A system according to claim 90, wherein the following conditions are satisfied:

$$\hbar\omega_p = E_2 - E_1 - \delta$$

$$\delta < (E_2 - E_1)$$

where,
- $E_1$: energy of the first quantum level,
- $E_2$: energy of the second quantum level,
- $\hbar\omega_p$: photon energy of the light irradiating said first and second semiconductors, and
- $\delta$: detuning energy.

* * * * *

UNITED STATES PATENT AND TRADEMARK OFFICE
CERTIFICATE OF CORRECTION

PATENT NO. : 5,153,688
DATED : October 6, 1992
INVENTOR(S) : HITOSHI ODA, ET AL.

It is certified that error appears in the above-identified patent and that said Letters Patent is hereby corrected as shown below:

Title page, item

[56] REFERENCES CITED

Under OTHER PUBLICATIONS,
Under Yamanishi et al., "27 p. -2-1," should read --27P-Z-1,-- and "Daha et al.," should read --Datta et al.,--.

COLUMN 2

Line 50, "is" should read --is preferable to--.
Line 51, "preferable as" should be deleted.

COLUMN 10

Line 41, "A(As and A(GaAs" should read --AlAs and AlGaAs--.

COLUMN 11

Line 42, "layer," should read --layer, ¶ $E_{av}$: energy of a quantum level existing in a valence band of said first semiconductor layer,--.
Line 43, "$E_{av}$:" should read --$E_{bi}$:--.

UNITED STATES PATENT AND TRADEMARK OFFICE
CERTIFICATE OF CORRECTION

PATENT NO. : 5,153,688

DATED : October 6, 1992

INVENTOR(S) : HITOSHI ODA, ET AL.

It is certified that error appears in the above-identified patent and that said Letters Patent is hereby corrected as shown below:

COLUMN 12

Line 57, "the quantum" should read --the first and second semiconductor layers and the energy of the quantum--.

COLUMN 16

Line 33, "$E_{avg}$" should read --$E_{av}$--.

COLUMN 17

Line 24, "said" should read --the--.

COLUMN 18

Lines 35-44 should be deleted.

COLUMN 19

Line 14, "substrate." should read --substrate,--.
    Line 18, "layer" should read --layer defining--.

COLUMN 20

Line 20, "conduction layers," should read --conduction band of at least one of the first and second conductor layers,--.
    Line 49, "said" should read --the--.

UNITED STATES PATENT AND TRADEMARK OFFICE
CERTIFICATE OF CORRECTION

PATENT NO. : 5,153,688
DATED : October 6, 1992
INVENTOR(S) : HITOSHI ODA, ET AL.

It is certified that error appears in the above-identified patent and that said Letters Patent is hereby corrected as shown below:

COLUMN 21

Line 44, "ℏwp:" should read --ℏwp:--.

COLUMN 22

Line 42, "said" should read --the--.

COLUMN 24

Line 5, "quantum" should read --quantum well--.
  Line 12, "irradiates" should read --irradiates the--.
  Line 33, "$\delta<(E_2-E)$" should read --$\delta<(E_2-E_1)$--.

COLUMN 25

Line 36, "$\delta<(E_{ai}-E_{av})$" should read --$\delta_a<(E_{ai}-E_{av})$--.

COLUMN 29

Line 6, "$\delta<(E_{ai}-E_{av})$" should read --$\delta_a<(E_{ai}-E_{av})$--.

UNITED STATES PATENT AND TRADEMARK OFFICE
CERTIFICATE OF CORRECTION

PATENT NO. : 5,153,688
DATED : October 6, 1992
INVENTOR(S) : HITOSHI ODA, ET AL.

It is certified that error appears in the above-identified patent and that said Letters Patent is hereby corrected as shown below:

COLUMN 31

Line 9, "the" should read --a--.

Signed and Sealed this

Twenty-second Day of February, 1994

Attest:

BRUCE LEHMAN

*Attesting Officer*     *Commissioner of Patents and Trademarks*